United States Patent
Goto

(10) Patent No.: US 12,550,673 B2
(45) Date of Patent: Feb. 10, 2026

(54) CERAMIC SUBSTRATE, ELECTROSTATIC CHUCK, SUBSTRATE FIXING DEVICE, AND PACKAGE FOR SEMICONDUCTOR DEVICE

(71) Applicant: SHINKO ELECTRIC INDUSTRIES CO., LTD., Nagano (JP)

(72) Inventor: Akira Goto, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 267 days.

(21) Appl. No.: 18/187,917

(22) Filed: Mar. 22, 2023

(65) Prior Publication Data

US 2023/0307282 A1    Sep. 28, 2023

(30) Foreign Application Priority Data

Mar. 24, 2022 (JP) ................ 2022-048585

(51) Int. Cl.
| | | |
|---|---|---|
| *H01L 21/683* | (2006.01) | |
| *C04B 35/64* | (2006.01) | |
| *H01L 21/687* | (2006.01) | |

(52) U.S. Cl.
CPC .......... *H01L 21/6833* (2013.01); *C04B 35/64* (2013.01); *H01L 21/68757* (2013.01); *H01L 21/68785* (2013.01); *C04B 2235/3217* (2013.01)

(58) Field of Classification Search
CPC ........... H01L 21/6833; H01L 21/68757; H01L 21/68785; H01L 23/49838; H01L 21/4846; H01L 23/15; H01L 23/142; H01L 23/49866; C04B 35/64; C04B 2235/3217; C04B 2235/77; C04B 2235/786; C04B 2237/343; C04B 2237/68; B32B 18/00
See application file for complete search history.

(56) References Cited

U.S. PATENT DOCUMENTS

| | | | |
|---|---|---|---|
| 5,928,769 A | 7/1999 | Monma et al. | |
| 6,351,367 B1* | 2/2002 | Mogi | B25B 11/002 29/829 |
| 2004/0131878 A1* | 7/2004 | Seet | C23C 14/165 428/641 |
| 2007/0077682 A1* | 4/2007 | Cerio | H01L 21/2855 257/E21.586 |
| 2008/0212255 A1* | 9/2008 | Miyaji | H01L 21/68757 361/234 |

(Continued)

FOREIGN PATENT DOCUMENTS

| | | |
|---|---|---|
| JP | H9-260543 A | 10/1997 |
| JP | 2003-168753 A | 6/2003 |
| JP | 2020-43336 A | 3/2020 |

OTHER PUBLICATIONS

Japanese Office Action issued Jun. 25, 2025 in corresponding Japanese application No. 2022-048585; English machine translation included (12 pages).

*Primary Examiner* — Thienvu V Tran
*Assistant Examiner* — Muaamar Qahtan Al-Taweel
(74) *Attorney, Agent, or Firm* — Rankin, Hill & Clark LLP

(57) ABSTRACT

A ceramic substrate includes a base body, and an electrical conductor pattern embedded in the base body. The base body is composed of ceramics. The electrical conductor pattern has, as a main component, a solid solution having a body-centered cubic lattice structure in which copper is solid-dissolved in tungsten.

8 Claims, 9 Drawing Sheets

(56) References Cited

U.S. PATENT DOCUMENTS

| | | | |
|---|---|---|---|
| 2008/0276865 A1* | 11/2008 | Nishimizu | H01L 21/6831 |
| | | | 118/500 |
| 2010/0103584 A1* | 4/2010 | Nam | H01L 21/6831 |
| | | | 156/60 |
| 2013/0201598 A1* | 8/2013 | Ishikawa | H02N 13/00 |
| | | | 216/13 |
| 2017/0314097 A1* | 11/2017 | Hong | C22C 32/0015 |
| 2020/0075383 A1 | 3/2020 | Minemura | |
| 2020/0106009 A1* | 4/2020 | Wu | H10N 50/01 |
| 2022/0199451 A1* | 6/2022 | Lee | C04B 35/565 |

* cited by examiner

CERAMIC SUBSTRATE, ELECTROSTATIC CHUCK, SUBSTRATE FIXING DEVICE, AND PACKAGE FOR SEMICONDUCTOR DEVICE

CROSS-REFERENCE TO RELATED APPLICATIONS

This application claims priority from Japanese Patent Application No. 2022-048585, filed on Mar. 24, 2022, the entire content of which is incorporated herein by reference.

TECHNICAL FIELD

The present invention relates to a ceramic substrate, an electrostatic chuck, a substrate fixing device, and a package for a semiconductor device.

BACKGROUND ART

In the related art, a film formation apparatus and a plasma etching apparatus that are used when manufacturing a semiconductor device each have a stage for accurately holding a wafer in a vacuum treatment chamber. As such a stage, for example, suggested is a substrate fixing device configured to suck and hold a wafer by an electrostatic chuck mounted on a base plate, for example.

The electrostatic chuck is configured by a ceramic substrate having a base body, an electrostatic electrode embedded in the base body, and the like. The electrostatic electrode is, for example, a sintered body having tungsten as a main component and including nickel oxide, aluminum oxide, and silicon dioxide (refer to Patent Literature 1, for example).

CITATION LIST

Patent Literature

Patent Literature 1: JP2020-43336A

SUMMARY OF INVENTION

In the sintered body described above, ceramic and tungsten are sintered under the same conditions. However, since tungsten has a high melting point (3300° C. or higher), it is difficult to sinter the same, and therefore, it is needed to add an appropriate sintering aid. In the sintered body described above, nickel oxide, aluminum oxide, and silicon dioxide function as sintering aids. Although a liquefaction temperature changes depending on the sintering aid to be added, there is a need for a sintering aid capable of lowering the liquefaction temperature than the related art, which enables sintering at a relatively low temperature.

The present invention has been made in view of the above situations, and an object thereof is to enable sintering of an electrical conductor pattern of a ceramic substrate at a lower temperature than the related art.

According to an aspect of the present disclosure, there is provided a ceramic substrate includes a base body, and an electrical conductor pattern embedded in the base body. The base body is composed of ceramics. The electrical conductor pattern has, as a main component, a solid solution having a body-centered cubic lattice structure in which copper is solid-dissolved in tungsten.

According to the disclosed technology, it is possible to enable sintering of the electrical conductor pattern of the ceramic substrate at a lower temperature than the related art.

DESCRIPTION OF EMBODIMENTS

Hereinafter, embodiments of the present invention will be described with reference to the drawings. Note that, in the respective drawings, the parts having the same configurations are denoted with the same reference signs, and the overlapping descriptions may be omitted.

First Embodiment

[Structure of Substrate Fixing Device]

Figure 1:
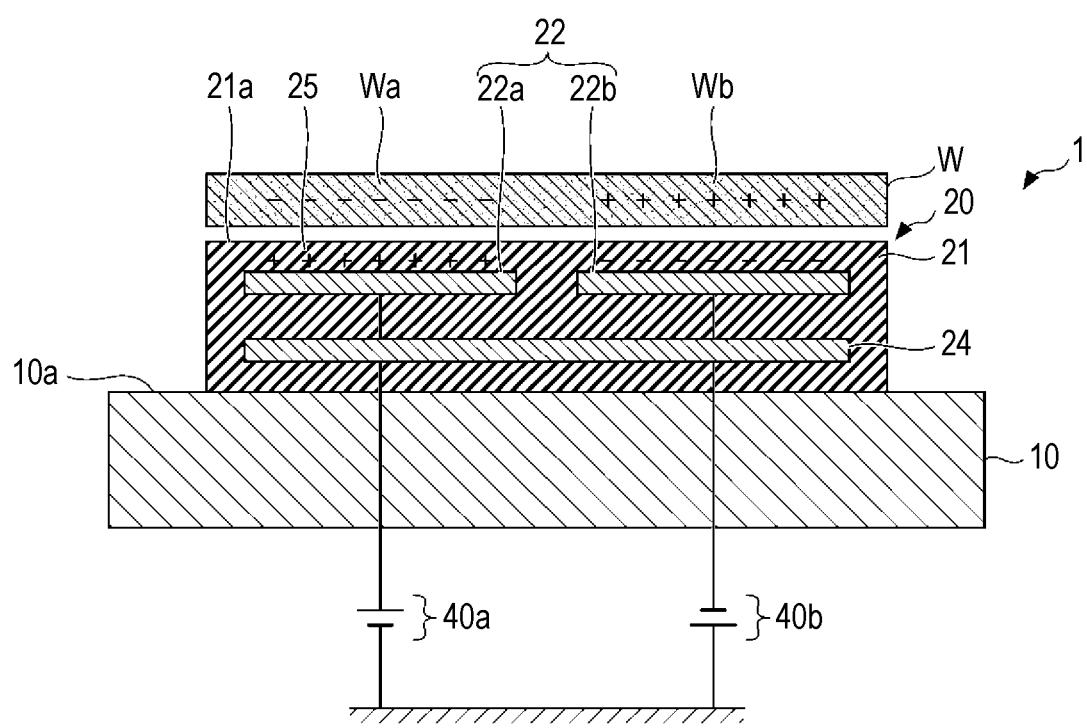
FIG. 1 is a sectional view simplifying and exemplifying a substrate fixing device according to a first embodiment.

FIG. 1 is a sectional view simplifying and exemplifying a substrate fixing device according to a first embodiment. Referring to FIG. 1, a substrate fixing device 1 has, main constitutional elements, a base plate 10, and an electrostatic chuck 20. The substrate fixing device 1 is a device configured to suck and hold a substrate W (for example, a semiconductor wafer, and the like), which is a suction target object, by the electrostatic chuck 20.

The base plate 10 is a member for mounting the electrostatic chuck 20. A thickness of the base plate 10 is, for example, about 20 to 40 mm. The base plate 10 is formed of, for example, a metal material such as aluminum and cemented carbide, a composite material of the metal material and a ceramic material, or the like, and may be used as an electrode or the like for controlling plasma. For example, from standpoints of easy availability, easy processing, favorable thermal conductivity and the like, aluminum or an alloy thereof is used, and the material whose surface has been subjected to an alumite treatment (insulation layer formation) may be favorably used.

For example, by supplying predetermined high-frequency electrical power to the base plate 10, the energy for causing ions and the like in a generated plasma state to collide with the substrate W sucked on the electrostatic chuck 20 can be controlled to effectively perform etching processing.

The base plate 10 may be provided therein with a gas supply path for introducing an inert gas for cooling the substrate W sucked on the electrostatic chuck 20. When an inert gas such as He or Ar is introduced into the gas supply path from an outside of the substrate fixing device 1 and the inert gas is supplied to a back surface of the substrate W sucked on the electrostatic chuck 20, the substrate W can be cooled.

The base plate 10 may be provided therein with a coolant flow path. The coolant flow path is, for example, a hole formed in an annular shape in the base plate 10. For example, coolant such as cooling water and GALDEN is introduced into the coolant flow path from an outside of the substrate fixing device 1. By circulating the coolant in the coolant flow path to cool the base plate 10, it is possible to cool the substrate W sucked on the electrostatic chuck 20.

The electrostatic chuck 20 is a part configured to suck and hold the substrate W that is a suction target object. A planar shape of the electrostatic chuck 20 is formed according to a shape of the substrate W, and is circular, for example. A diameter of the wafer that is a suction target object of the electrostatic chuck 20, is, for example, 8 inches, 12 inches or 18 inches.

Note that, the description 'as seen from above' indicates that a target object is seen from a normal direction of an upper surface 10a of the base plate 10, and the description 'planar shape' indicates a shape of the target object as seen from the normal direction of the upper surface 10a of the base plate 10.

The electrostatic chuck 20 is provided on the upper surface 10a of the base plate 10 via an adhesive layer. The adhesive layer is, for example, a silicone-based adhesive. A thickness of the adhesive layer is, for example, about 0.1 to 2.0 mm. The adhesive layer has effects of bonding the base plate 10 and the electrostatic chuck 20 and reducing stress that is caused due to a difference in thermal expansion coefficient between the ceramic electrostatic chuck 20 and the aluminum base plate 10. Note that, the electrostatic chuck 20 may also be fixed to the base plate 10 by a screw.

The electrostatic chuck 20 is a ceramic substrate having, main constitutional elements, a base body 21, an electrostatic electrode 22, and a heat-generating element 24. An upper surface of the base body 21 is a placement surface 21a on which a suction target object is placed. The electrostatic chuck 20 is, for example, a Johnsen-Rahbeck type electrostatic chuck. However, the electrostatic chuck 20 may also be a Coulomb-type electrostatic chuck.

The base body 21 is a dielectric body. A thickness of the base body 21 is, for example, about 5 to 10 mm, and a relative permittivity (1 kHz) of the base body 21 is, for example, about 9 to 10. The base body 21 is a ceramic composed of, for example, aluminum oxide ($Al_2O_3$), aluminum nitride (AlN), yttrium aluminum garnet (YAG), or the like. Among these, it is preferable to use a ceramic composed of aluminum oxide, which is easy to sinter, is relatively low-cost, and has a high electrical resistance. Here, "ceramic composed of aluminum oxide" means ceramic to which an inorganic component other than aluminum oxide is not added.

The base body 21 preferably has a purity of the aluminum oxide of 99.5% or higher. The purity of 99.5% or higher indicates that a sintering aid is not added. In addition, the purity of 99.5% or higher means that unintended impurities may be included during a manufacturing process and the like. The base body 21 preferably has a relative density of 97% or greater with respect to the aluminum oxide. The base body 21 preferably has an average particle diameter of the aluminum oxide of 1.0 μm or greater and 3.0 μm or smaller.

The electrostatic electrode 22 is a thin film electrode formed by an electric conductor pattern, and is embedded in the base body 21. In the present embodiment, the electrostatic electrode 22 is a double-electrode type, and has a first electrostatic electrode 22a and a second electrostatic electrode 22b. Note that, as the electrostatic electrode 22, a single-electrode type consisting of one electrostatic electrode may also be used. The electrostatic electrode 22 has, as a main component, a solid solution having a body-centered cubic lattice structure in which copper is solid-dissolved in tungsten. Here, the main component means a component that accounts for 50 wt. % or more of total materials constituting the electrostatic electrode 22. In the electrostatic electrode 22, a ratio of copper to tungsten is preferably 0.05 wt. % or greater and 10 wt. % or less.

The first electrostatic electrode 22a is connected to a positive electrode side of a power supply 40a provided outside the substrate fixing device 1. In addition, the second electrostatic electrode 22b is connected to a negative electrode side of a power supply 40b provided outside the substrate fixing device 1. A negative electrode side of the power supply 40a and a positive electrode side of the power supply 40b are connected outside the substrate fixing device 1, and a connection point becomes a ground potential.

A positive (+) voltage is applied to the first electrostatic electrode 22a from the power supply 40a, and a negative (−) voltage is applied to the second electrostatic electrode 22b from the power supply 40b. As a result, positive (+) charges are charged on the first electrostatic electrode 22a and negative (−) charges are charged on the second electrostatic electrode 22b. Along with this, negative (−) charges are induced in a part Wa of the substrate W corresponding to the first electrostatic electrode 22a, and positive (+) charges are induced in a part Wb of the substrate W corresponding to the second electrostatic electrode 22b.

When the substrate W, the electrostatic electrode 22 and a ceramic part 25 of the electrostatic chuck 20 (base body 21) disposed therebetween are regarded as capacitors, the ceramic part 25 corresponds to a dielectric layer. Then, the substrate W is electrostatically sucked on the electrostatic chuck 20 by a Coulomb's force generated between the electrostatic electrode 22 and the substrate W via the ceramic part 25. The higher the voltage applied to the electrostatic electrode 22 is, the stronger the suction holding force is.

The heat-generating element 24 is a heater embedded in the base body 21 and configured to generate heat as a current flows therethrough, thereby heating a placement surface 21a of the base body 21 to a predetermined temperature. The heat-generating element 24 is disposed on a lower side (base plate 10 side) of the first electrostatic electrode 22a and the second electrostatic electrode 22b. The heat-generating element 24 is an electrical conductor formed into a film shape. The heat-generating element 24 is provided as a plurality of heater electrodes capable of independently performing heating control on a plurality of regions (heater zones) in a plane of the base body 21.

Note that, the heat-generating element 24 may be provided as one heater electrode. The heat-generating element 24 has, as a main component, a solid solution having a body-centered cubic lattice structure in which copper is solid-dissolved in tungsten, for example.

When current is supplied to the heat-generating element 24 from a power supply provided outside the substrate fixing device 1, the heat-generating element 24 generates heat, and therefore, the electrostatic chuck 20 is heated. The substrate W is controlled to a predetermined temperature by the temperature of the electrostatic chuck 20. The heating temperature of the electrostatic chuck 20 is set within the range of 50° C. to 200° C., for example, to 150° C.

Figure 2:
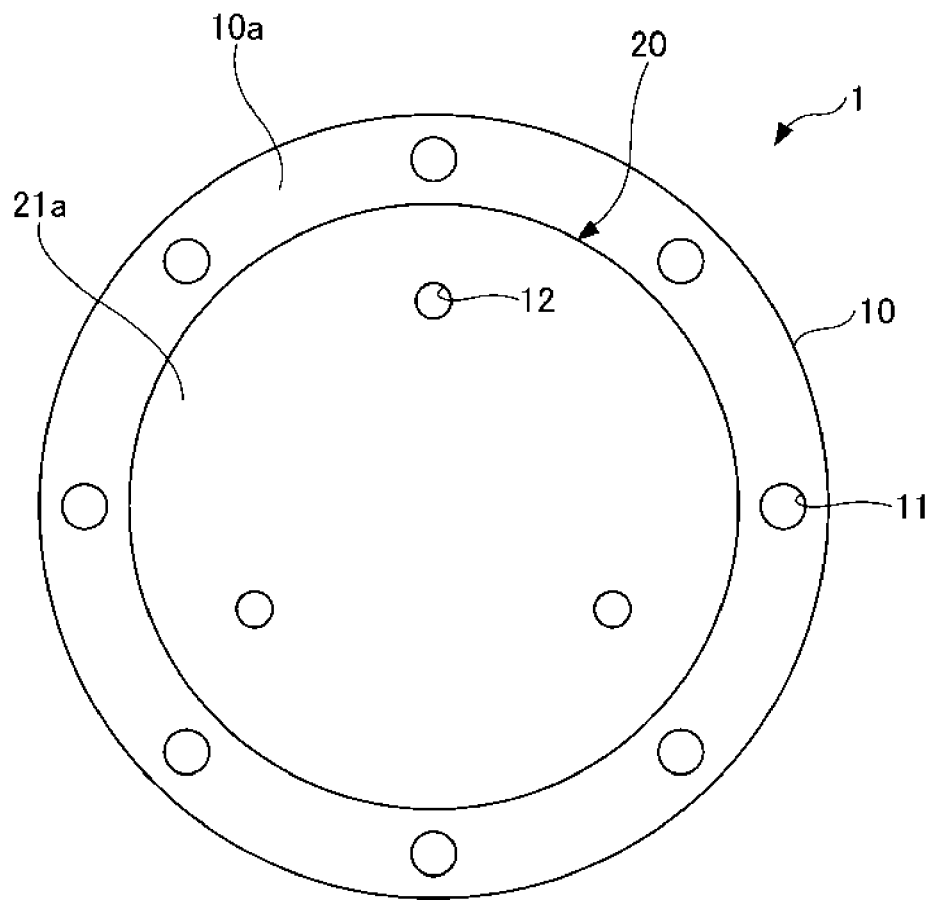
FIG. 2 is a plan view simplifying and exemplifying the substrate fixing device according to the first embodiment.

FIG. 2 is a plan view simplifying and exemplifying the substrate fixing device according to the first embodiment. Referring to FIG. 2, in the substrate fixing device 1, the electrostatic chuck 20 is disposed on the disk-shaped base plate 10, and a peripheral edge portion of the base plate 10 is exposed around the electrostatic chuck 20. Attachment holes 11 for attaching the substrate fixing device to a chamber of a semiconductor manufacturing apparatus are formed in the peripheral edge portion of the base plate 10 to be aligned along the peripheral edge portion.

In addition, each of the electrostatic chuck 20 and the base plate 10 has a plurality of (three in FIG. 2) opening portions 12 for lift pins in a central portion thereof. Lift pins that move the substrate W in an upper and lower direction are inserted into the opening portions 12 for lift pins. When the substrate W is moved up from the placement surface 21a by the lift pins, the substrate W can be automatically conveyed by a conveyor device.

[Method of Manufacturing Electrostatic Chuck]

Next, a method of manufacturing the electrostatic chuck 20 will be described. FIGS. 3A, 3B, 3C and 4 are perspective views exemplifying a process of manufacturing the electrostatic chuck according to the first embodiment.

Figure 3A:
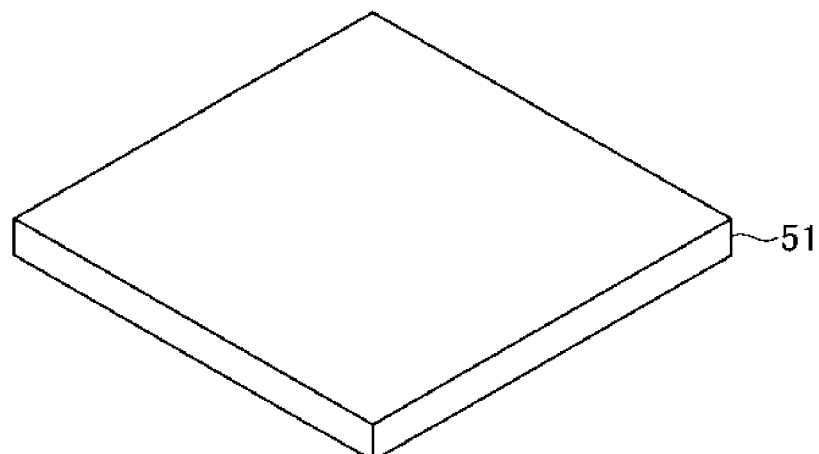
FIGS. 3A, 3B, 3C are perspective views (part 1) exemplifying a process of manufacturing an electrostatic chuck according to the first embodiment.

First, as shown in FIG. 3A, a green sheet 51 composed of a ceramic material and an organic material is prepared. The green sheet 51 is formed into a shape of a rectangular plate, for example. The ceramic material of the green sheet 51 is composed of aluminum oxide and does not include a sintering aid. The organic component is removed from the green sheet 51, and the ceramic material is sintered and densified, so that the green sheet 51 becomes the base body 21 of a part where the substrate W shown in FIG. 1 is mounted.

Figure 3B:
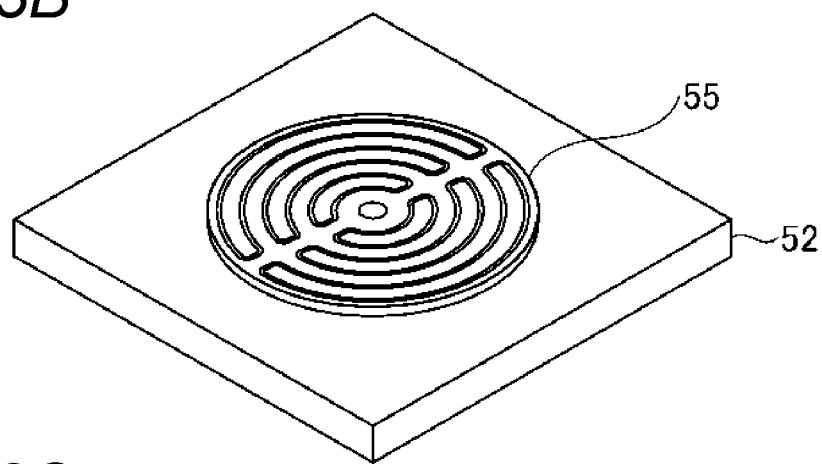

Next, as shown in FIG. 3B, a green sheet 52 composed of a similar material and having a similar shape to those of the green sheet 51 is prepared, and an electrically conductive paste is printed on an upper surface of the green sheet 52 by, for example, a printing method (screen printing), thereby forming an electrical conductor pattern 55. The electrical conductor pattern 55 is fired in a process described later to be the electrostatic electrode 22 shown in FIG. 1. Note that, the electrical conductor pattern 55 may also be formed on a lower surface of the green sheet 51.

The electrically conductive paste that is used for forming the electrical conductor pattern 55 has, for example, tungsten as a main component and includes copper oxide. The electrically conductive paste that is used for forming the electrical conductor pattern 55 may further contain an organic material and the like. An addition amount of copper oxide is preferably 0.1 g or more and 10 g or less with respect to 100 g of tungsten, for example. That is, in the electrically conductive paste, a ratio of copper oxide to tungsten is preferably 0.1 wt. % or greater and 10 wt. % or less. When the ratio of copper oxide to tungsten is 0.1 wt. % or greater, the liquefaction temperature of the electrically conductive paste can be set to about 1100° C.

Even when the ratio of copper oxide to tungsten is greater than 10 wt. %, the liquefaction temperature of the electrically conductive paste is still about 1100° C. However, when the ratio of copper oxide to tungsten exceeds 10 wt. %, it is difficult to secure electrical characteristics of tungsten in a solid solution of tungsten and copper produced by sintering the electrically conductive paste. Therefore, the ratio of copper oxide to tungsten is preferably 10 wt. % or less. Note that, in co-firing the electrically conductive paste and the green sheet, an average particle diameter of tungsten is preferably 0.5 μm or greater and 3.0 μm or smaller.

Figure 3C:
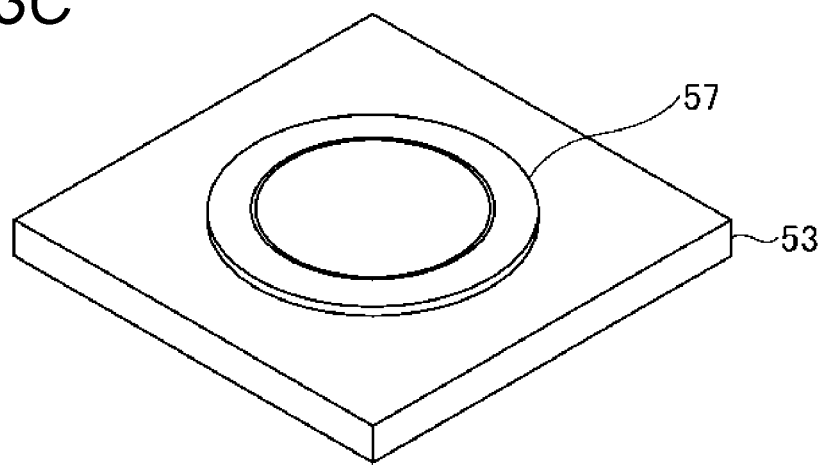

Next, as shown in FIG. 3C, a green sheet 53 composed of a similar material and having a similar shape to those of the green sheet 51 is prepared, and an electrically conductive paste is printed on an upper surface of the green sheet 53 by, for example, a printing method (screen printing), thereby forming an electrical conductor pattern 57. For the electrically conductive paste for forming the electrical conductor pattern 57, an electrically conductive paste composed of the same material as the electrically conductive paste for forming the electrical conductor pattern 55 described above may be used. The green sheet 53 is for forming the heat-generating element 24 shown in FIG. 1 by being fired, and becomes the base body 21 of a part to be bonded to the base plate 10. The electrical conductor pattern 57 is fired in a process described later to be the heat-generating element 24. Note that, the electrical conductor pattern 57 may also be formed on a lower surface of the green sheet 52.

Figure 4A:
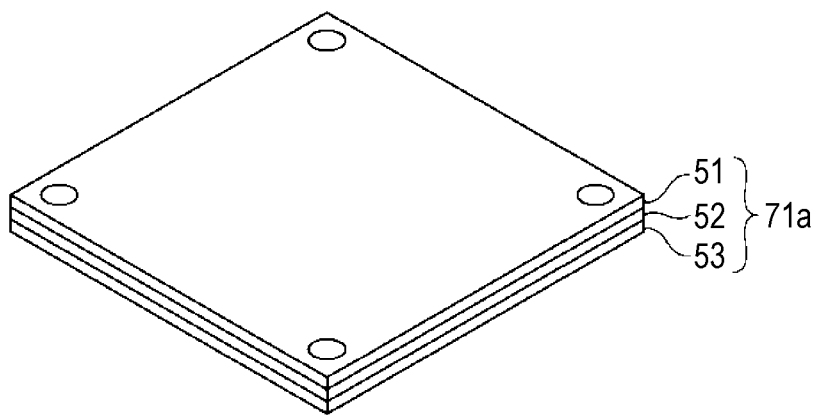
FIGS. 4A, 4B, 4C are perspective views (part 2) exemplifying the process of manufacturing the electrostatic chuck according to the first embodiment.

Next, as shown in FIG. 4A, each of the green sheets 51 to 53 is laminated to form a structure 71a. The green sheets 51 and 53 are bonded to one another by pressurizing the green sheets while heating the same. Next, as shown in FIG. 4B, a periphery of the structure 71a is cut to form a disk-shaped structure 71b.

Figure 4B:
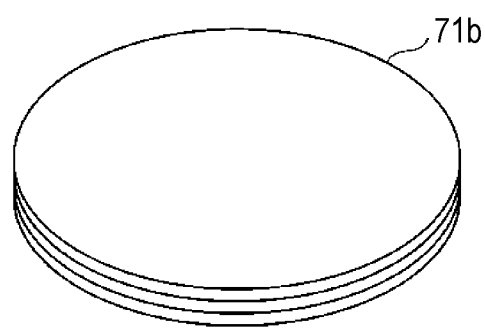
Figure 4C:
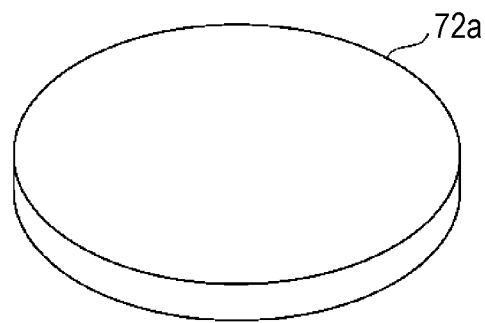

Next, the structure 71b shown in FIG. 4B is fired to obtain a ceramic substrate 72a shown in FIG. 4C. The temperature at the time of firing is, for example, 1600° C. In this process, the electrostatic electrode 22 is obtained by sintering the electrical conductor pattern 55, and the heat-generating element 24 is obtained by sintering the electrical conductor pattern 57. Since the liquefaction temperature of the electrically conductive paste in which copper oxide is added to tungsten is about 1100° C., the electrically conductive paste is easily sintered at the temperature (for example, 1600° C.) at the time of firing the ceramic substrate 72a. This forms the electrostatic electrode 22 and the heat-generating element 24 each having a solid solution having a body-centered cubic lattice structure in which copper is solid-dissolved in tungsten, as a main component.

Next, various processing is performed on the ceramic substrate 72a to complete the electrostatic chuck 20. For example, the upper and lower surfaces of the ceramic substrate 72a are polished to form a placement surface and an adhesive surface. Further, the opening portions 12 for lift pins shown in FIG. 1 are formed in the ceramic substrate 72a.

Hereinafter, the substrate fixing device and the like will be described in more detail with reference to Examples and Comparative Examples, but the present invention is not limited to these examples at all.

[Examination of Liquefaction Temperature]

First, as Comparative Example, the liquefaction temperature when 1 g of nickel oxide, 1 g of aluminum oxide, and 1 g of silicon dioxide were added to 100 g of tungsten, which was then fired in an atmosphere of nitrogen and hydrogen, was computed by Fact Sage (available from Research Center of Computational Mechanics, Inc.). Note that, Fact Sage is software that quantitatively predicts the thermodynamic equilibrium state of a multi-component system.

Figure 5A:
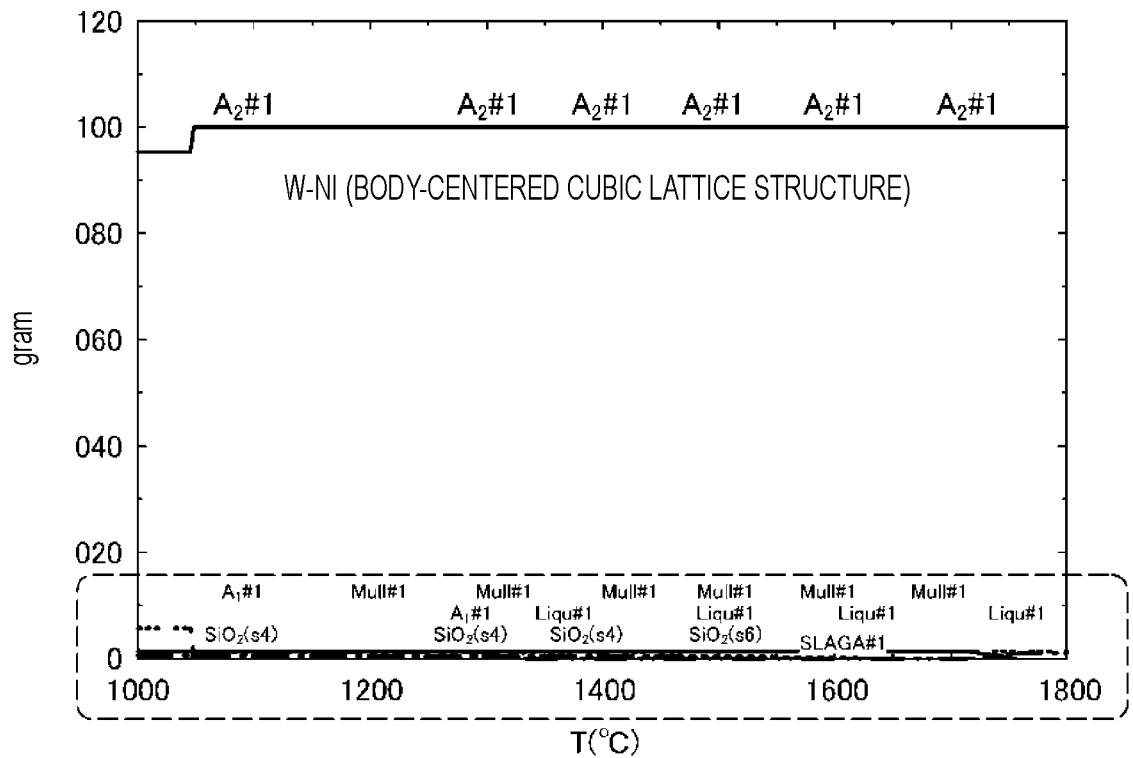
FIGS. 5A and 5B show results of examination of a liquefaction temperature (part 1).
Figure 5B:
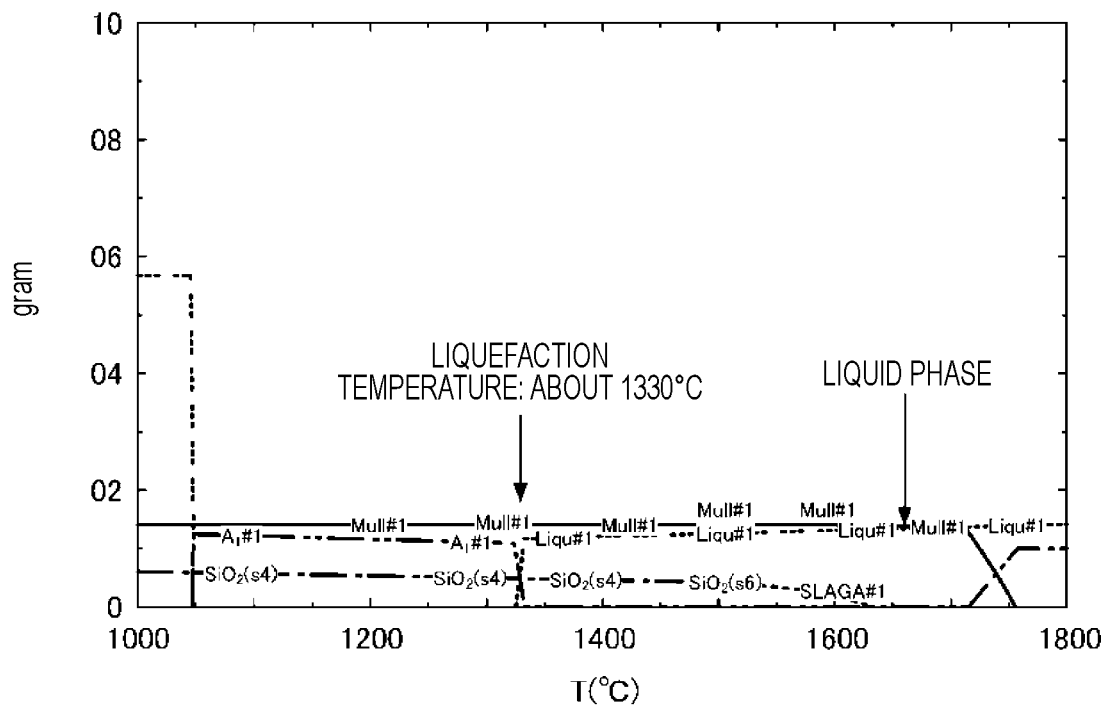

A computational result of Comparative Example is shown in FIGS. 5A and 5B. Note that, FIG. 5B is an enlarged view of a portion surrounded by a broken line in FIG. 5A. As shown in FIGS. 5A and 5B, it was confirmed by computation that a solid solution having a body-centered cubic lattice structure in which nickel was solid-dissolved in tungsten was formed by sintering the material according to Comparative Example. In addition, in Comparative Example, the liquefaction temperature was about 1330° C.

Next, as Example, the liquefaction temperature when 1 g of nickel oxide was added to 100 g of tungsten, which was then fired in an atmosphere of nitrogen and hydrogen, was computed by Fact Sage.

Figure 6A:
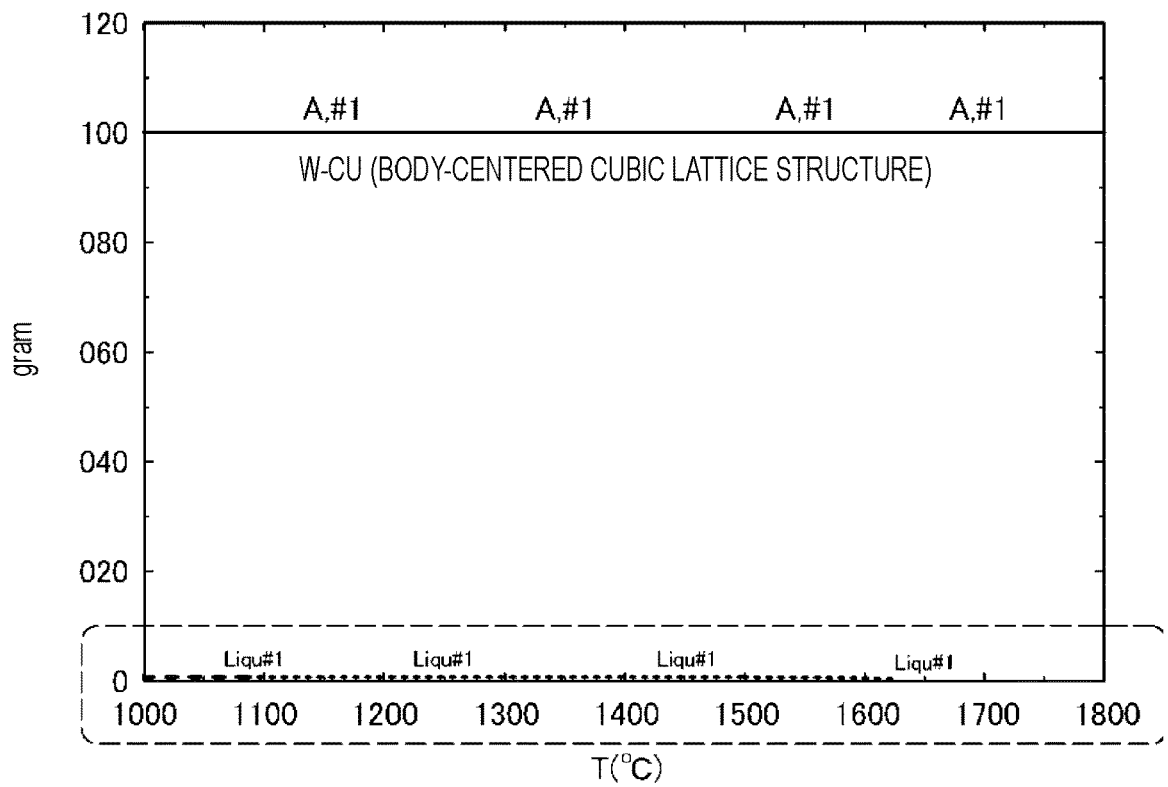
FIGS. 6A and 6B show results of examination of the liquefaction temperature (part 2).
Figure 6B:
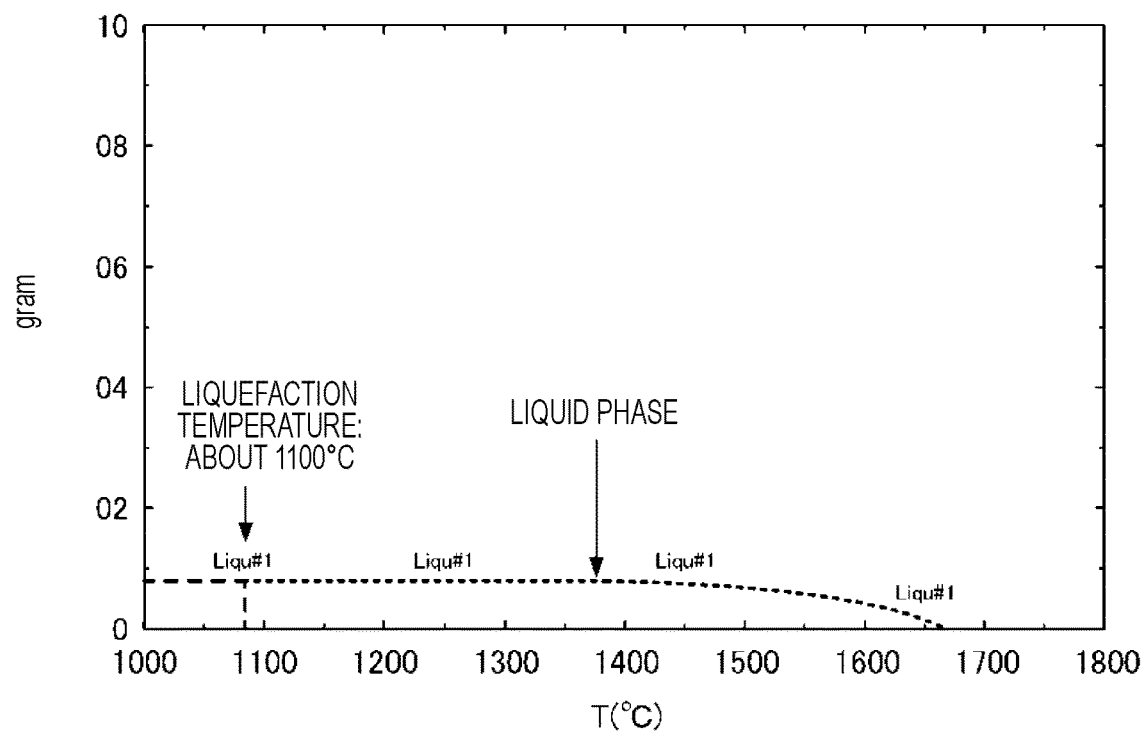

A computational result of Example is shown in FIGS. 6A and 6B. Note that, FIG. 6B is an enlarged view of a portion surrounded by a broken line in FIG. 6A. As shown in FIGS. 6A and 6B, it was confirmed by computation that a solid solution having a body-centered cubic lattice structure in which copper was solid-dissolved in tungsten was formed by sintering the material according to Example. In Example, the liquefaction temperature was about 1100° C.

Figure 7A:
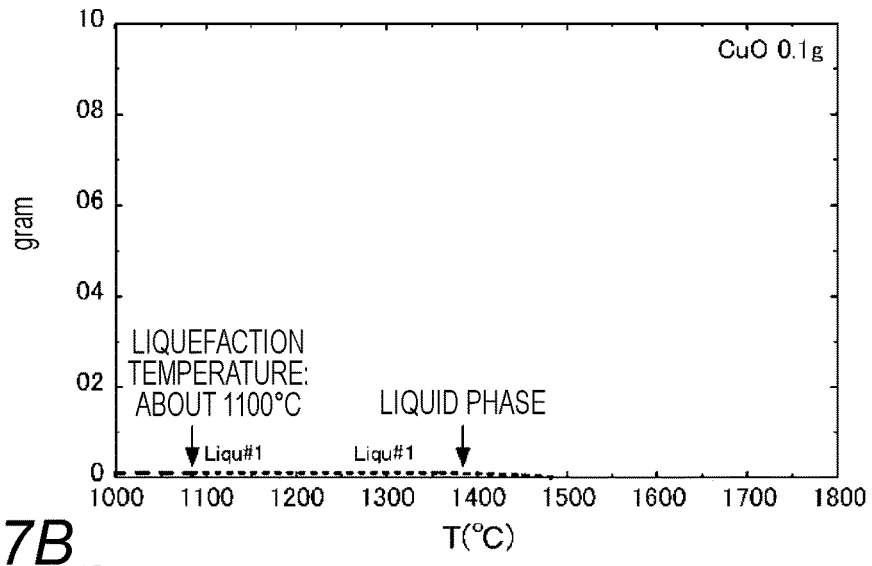
FIGS. 7A, 7B, and 7C show results of examination of the liquefaction temperature (part 3).
Figure 7B:
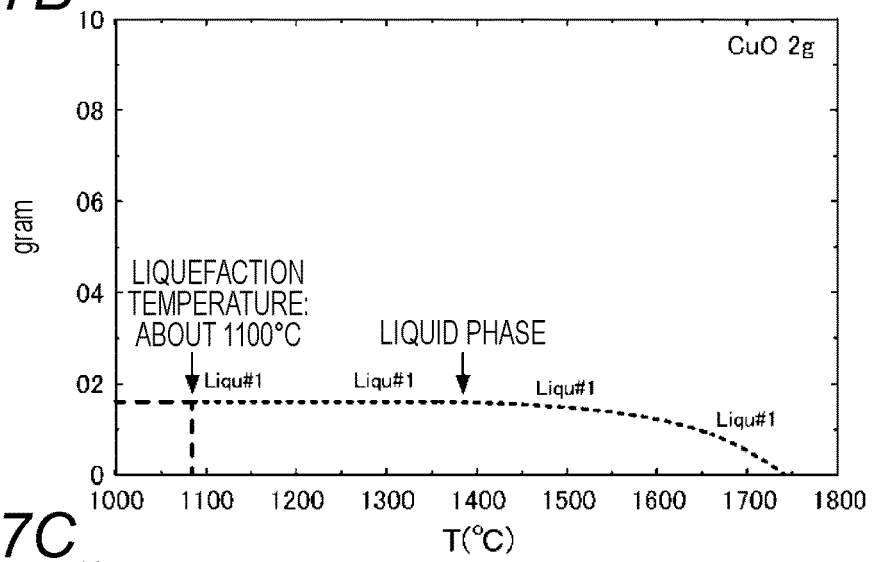
Figure 7C:
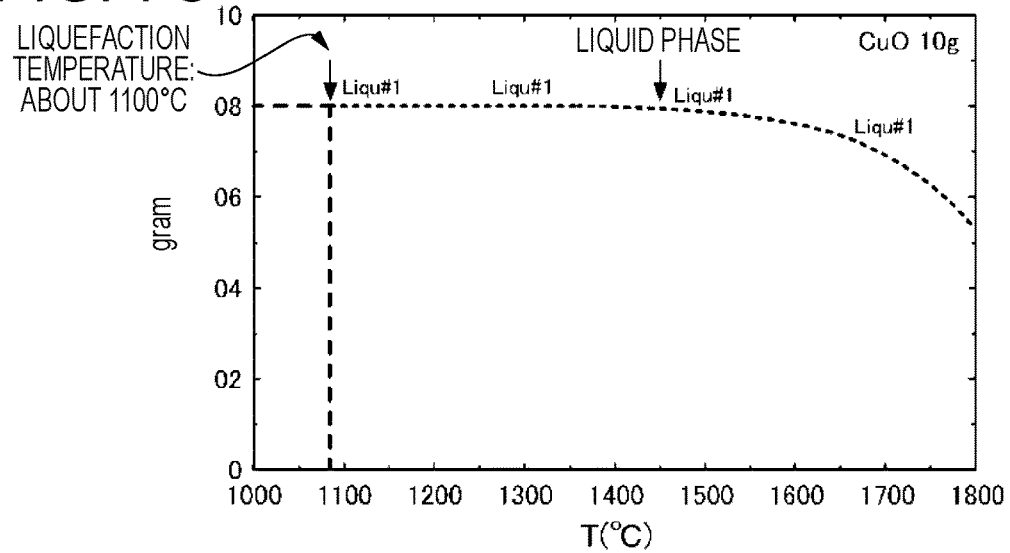

Next, it was computed by Fact Sage whether the liquefaction temperature changes depending on an amount of copper oxide added to tungsten. FIGS. 7A to 7C show computation results for cases where 0.1 g, 2 g and 10 g of copper oxide were added to 100 g of tungsten, respectively. As shown in FIGS. 7A to 7C, even when 0.1 g of copper oxide was added to 100 g of tungsten, it became liquefied, and the liquefaction temperature was about 1100° C. Further, it was found that even when the amount of copper oxide added to 100 g of tungsten was increased, an amount of the liquid phase just increased and the liquefaction temperature was constant at about 1100° C. That is, it was confirmed by computation that, when adding copper oxide to tungsten and firing the same, the liquefaction temperature did not depend on the amount of copper oxide added.

In this way, when copper oxide is added to tungsten and fired, the liquefaction temperature can be set to about 1100° C. Therefore, it is possible to sinter the electrical conductor pattern at a temperature about 150° C. lower than that of the related art (Comparative Example), and therefore, to improve the sinterability of tungsten.

Note that, when aluminum oxide is used for the base body, the sintering temperature is about 1500° C. to 1600° C. Therefore, the liquefaction temperature of the electrical conductor pattern may be lower than that the sintering temperature. However, the lower the liquefaction temperature is, it is easier to handle the liquefaction temperature, and it is also possible to use a material other than aluminum oxide, which is sintered at a lower temperature. In addition, the liquefaction temperature of the electrical conductor pattern is preferably 800° C. or higher because of restrictions in the firing process of the base body.

Second Embodiment

Figure 8:
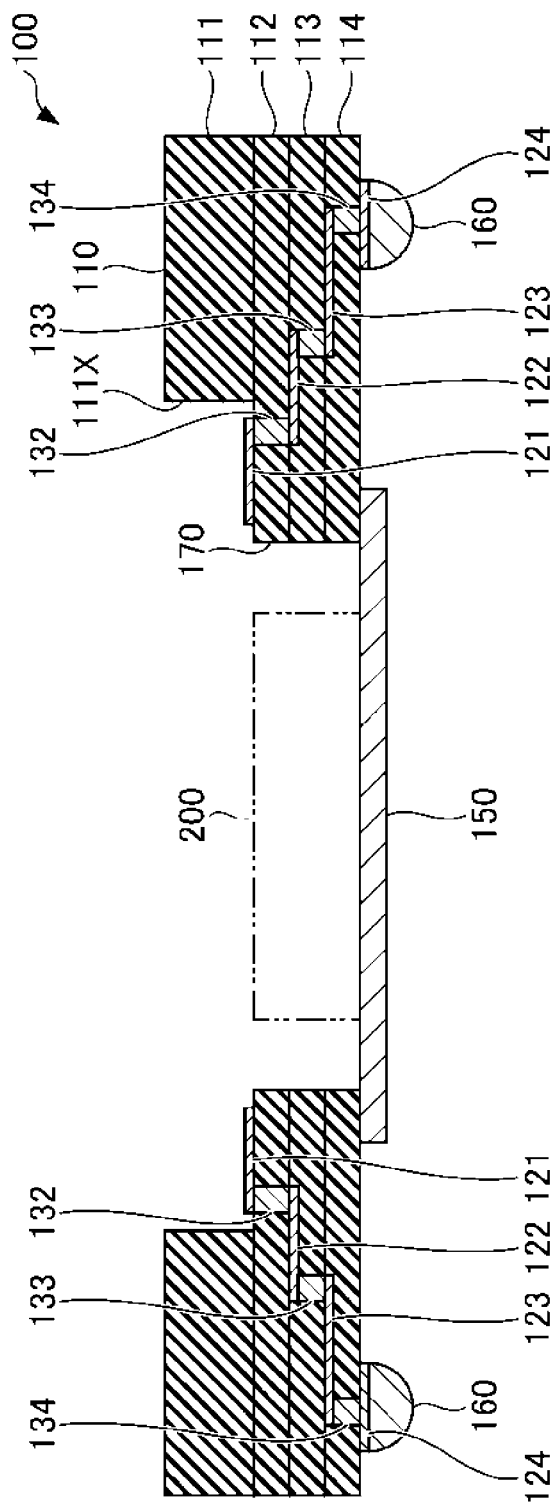
FIG. 8 is a sectional view exemplifying a package for a semiconductor device according to a second embodiment.
Figure 9:
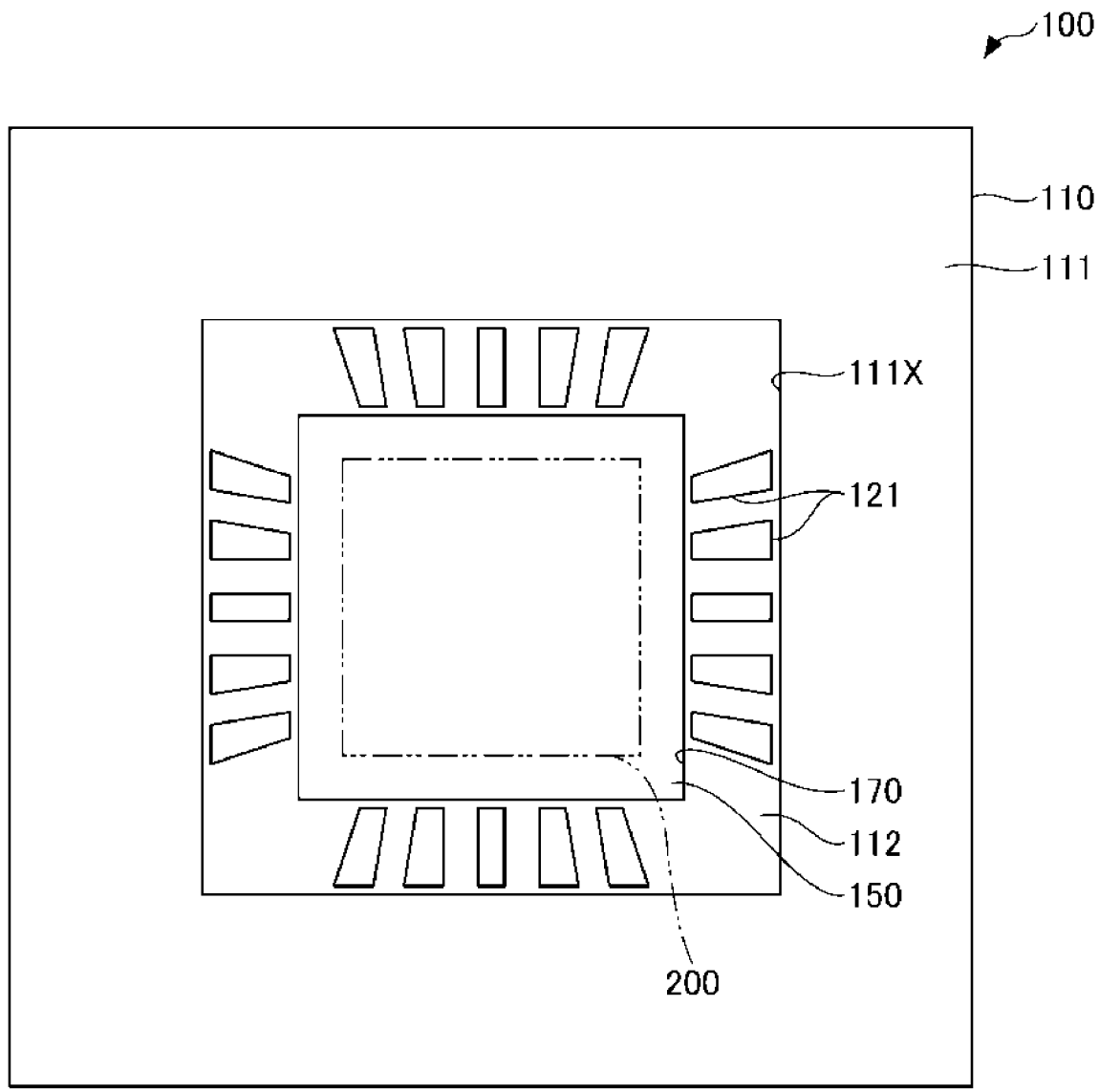
FIG. 9 is a plan view exemplifying the package for a semiconductor device according to the second embodiment.

In a second embodiment, an example of a package for a semiconductor device having the ceramic substrate described in the first embodiment is shown. FIG. 8 is a sectional view exemplifying a package for a semiconductor device according to a second embodiment. FIG. 9 is a plan view exemplifying the package for a semiconductor device according to the second embodiment.

As shown in FIG. 8, a package 100 for a semiconductor device includes a ceramic substrate 110, a heat-dissipating plate 150, and an external connection terminal 160, and the heat-dissipating plate 150 is soldered to the ceramic substrate 110.

The ceramic substrate 110 includes a plurality of (four in the present embodiment) laminated ceramic base materials 111, 112, 113 and 114, wiring patterns 121, 122, 123 and 124 as examples of an electrical conductor pattern, and vias 132, 133 and 134 penetrating through the ceramic base material 112, 113 and 114. The via 132 connects the wiring patterns 121 and 122 each other, the via 133 connects the wiring patterns 122 and 123 each other, and the via 134 connects the wiring patterns 123 and 124 each other. In the ceramic substrate 110, the ceramic base materials 111 to 114 constitute a base body.

As shown in FIGS. 8 and 9, the ceramic substrate 110 has a cavity 170 penetrating through central parts of the ceramic base materials 112, 113 and 114 and for mounting a semiconductor element 200. The wiring pattern 121 is disposed on an upper surface of the ceramic base material 112 so as to surround the cavity 170. An opening portion 111X that exposes the wiring pattern 121 is formed in the ceramic base material 111.

The ceramic base materials 111 to 114 are ceramics composed of aluminum oxide, and the wiring patterns 121 to 124 each have, as a main component, a solid solution having a body-centered cubic lattice structure in which copper is solid-dissolved in tungsten. In addition, the vias 132 to 134 are each a fired body having molybdenum as a main component and including nickel oxide, aluminum oxide, and silicon dioxide, for example. Further, the ceramic substrate 110 may be manufactured by a manufacturing method similar to that of the electrostatic chuck 20 of the first embodiment.

In the package 100 for a semiconductor device, the semiconductor element 200 is mounted on the heat-dissipating plate 150. A pad of the semiconductor element 200 is electrically connected to the wiring pattern 121 of the ceramic substrate 110 by a bonding wire or the like. In this way, the semiconductor element 200 is connected to the external connection terminal 160 via the wiring patterns 121 to 124 and the vias 132 to 134.

In the package 100 for a semiconductor device, the wiring patterns 121 to 124 may be formed by sintering an electrically conductive paste which has tungsten as a main component and to which copper oxide is added. Thereby, similarly to the first embodiment, it is possible to sinter the wiring pattern at a temperature about 230° C. lower than the related art, and therefore, to improve the sinterability of tungsten.

Although the preferred embodiment and the like have been described in detail, the present invention is not limited to the above-described embodiment and the like, and a variety of changes and replacements can be made for the above-described embodiment and the like without departing from the scope defined in the claims.

For example, in the first embodiment, the members included in the substrate fixing device or the layout thereof may be appropriately changed.

Also, in the first embodiment, the heat-generating element 24 may be disposed between the electrostatic chuck 20 and the base plate 10. In addition, the heat-generating element 24 may be provided in the base plate 10. Further, the heat-generating element 24 may be externally mounted below the electrostatic chuck.

Further, the substrate fixing device according to the first embodiment is applied to a semiconductor manufacturing apparatus, such as a dry etching apparatus (for example, a parallel flat plate type reactive ion etching (RIE) apparatus).

Further, as the suction target object of the substrate fixing device of the first embodiment, a glass substrate and the like that are used in a manufacturing process of a liquid crystal panel and the like may be exemplified, in addition to the semiconductor wafer (such as a silicon wafer).

This disclosure further encompasses various exemplary embodiments, for example, described below.

(1) A method of manufacturing a ceramic substrate having a base body and an electrical conductor pattern embedded in the base body, the method including:

forming an electrical conductor pattern on an upper surface of a green sheet by an electrically conductive paste in which copper oxide is added to tungsten; and firing the green sheet and the electrical conductor pattern to form the base body and the electrical conductor pattern.

(2) The method of manufacturing a ceramic substrate according to (1), in which a ratio of the copper oxide to the tungsten in the electrically conductive paste is 0.1 wt. % or greater and 10 wt. % or less.

What is claimed is:

1. A ceramic substrate comprising:
   a base body; and
   an electrical conductor pattern embedded in the base body,
   wherein the base body is composed of ceramics,
   wherein the electrical conductor pattern has, as a main component, a solid solution having a body-centered cubic lattice structure in which copper is solid-dissolved in tungsten, and
   wherein a ratio of copper to tungsten in the electrical conductor pattern is greater than or equal to 0.05 wt. % and less than or equal to 10 wt. %.

2. The ceramic substrate according to claim 1, wherein a main component of the base body is aluminum oxide.

3. The ceramic substrate according to claim 2, wherein the base body has a purity of the aluminum oxide of 99.5% or higher.

4. The ceramic substrate according to claim 2, wherein the base body has a relative density of 97% or greater with respect to aluminum oxide.

5. The ceramic substrate according to claim 2, wherein the base body has an average particle diameter of the aluminum oxide of 1.0 μm or greater and 3.0 μm or smaller.

6. A package for a semiconductor device comprising the ceramic substrate according to claim 1.

7. An electrostatic chuck comprising:
   a base body; and
   an electrostatic electrode, the electrostatic electrode being an electrical conductor pattern embedded in the base body,
   wherein the base body is composed of ceramics,
   wherein the electrical conductor pattern has, as a main component, a solid solution having a body-centered cubic lattice structure in which copper is solid-dissolved in tungsten, and
   wherein a ratio of copper to tungsten in the electrical conductor pattern is greater than or equal to 0.05 wt. % and less than or equal to 10 wt. %.

8. A substrate fixing device comprising:
   a base plate; and
   the electrostatic chuck according to claim 7 mounted on one surface of the base plate.

* * * * *